United States Patent
Sharma et al.

(10) Patent No.: US 12,394,630 B2
(45) Date of Patent: Aug. 19, 2025

(54) IN SITU GENERATION PROCESS AND SYSTEM

(71) Applicant: ASM IP Holding B.V., Almere (NL)

(72) Inventors: Varun Sharma, Helsinki (FI); Michael Givens, Oud-Heverlee (BE)

(73) Assignee: ASM IP HOLDING B.V., Almere (NL)

( * ) Notice: Subject to any disclaimer, the term of this patent is extended or adjusted under 35 U.S.C. 154(b) by 371 days.

(21) Appl. No.: 17/872,054

(22) Filed: Jul. 25, 2022

(65) Prior Publication Data
US 2023/0032495 A1    Feb. 2, 2023

Related U.S. Application Data

(60) Provisional application No. 63/226,196, filed on Jul. 28, 2021.

(51) Int. Cl.
| | |
|---|---|
| *H01L 21/3065* | (2006.01) |
| *H01L 21/02* | (2006.01) |
| *H01L 21/311* | (2006.01) |
| *H01L 21/67* | (2006.01) |

(52) U.S. Cl.
CPC .... *H01L 21/3065* (2013.01); *H01L 21/02049* (2013.01); *H01L 21/02178* (2013.01); *H01L 21/31111* (2013.01); *H01L 21/31116* (2013.01); *H01L 21/31122* (2013.01); *H01L 21/67017* (2013.01); *H01L 21/67063* (2013.01); *H01L 21/67069* (2013.01)

(58) Field of Classification Search
None
See application file for complete search history.

(56) References Cited

U.S. PATENT DOCUMENTS

2018/0350620 A1* 12/2018 Zaitsu ............... H01L 21/31122

FOREIGN PATENT DOCUMENTS

WO    WO2018106955 A1    6/2018

OTHER PUBLICATIONS

S.K. Murad, Thesis—Characterization of dry etching processes of III-V semiconductor in silicon tetrachloride plasma, Glasgow University, p. 55. (Year: 1994).*

* cited by examiner

*Primary Examiner* — Jiong-Ping Lu
(74) *Attorney, Agent, or Firm* — Laine IP Oy; Mark W. Scott

(57) ABSTRACT

The present disclosure is directed to methods in situ generation of a hydrogen halide for use in an etching process for selective etching of a material from other(s) on a surface layer of a substrate, to methods of etching utilizing the in situ generated hydrogen halide, and to systems carrying the out the disclosed processes.

16 Claims, 3 Drawing Sheets

IN SITU GENERATION PROCESS AND SYSTEM

CROSS-REFERENCE TO RELATED APPLICATIONS

This patent application claims the benefit of U.S. Provisional Application No. 63/226,196, filed Jul. 28, 2021, the entirety of which is incorporated by reference herein.

FIELD

The present disclosure generally relates to methods and systems suitable for manufacturing electronic devices. More particularly, the disclosure relates to methods for the in situ generation of a hydrogen halide for an etching process, to etching methods utilizing the in situ generated hydrogen halide, and to systems for carrying the out the disclosed processes.

BACKGROUND

Vapor deposition processes such as atomic layer deposition (ALD) are well-known in the art. ALD processes typically utilize alternating and sequential pulses of vapor-phase reactants to deposit up to a monolayer of material in a controlled and highly-conformal manner. Thin films deposited by ALD are used in a wide variety of applications, such as in the formation of integrated circuits. Controlled removal of materials (etching) is also highly desirable in such applications. One issue in etching processes is that commonly used etchants pose storage, safety, and transportation issues. For example, hydrogen halide materials, e.g., HCl or HF, particularly in their anhydrous or pyridine form, are highly corrosive to most vessels and are dangerous to transport. Thus, having such materials on site for extended periods may be highly hazardous and undesirable. Accordingly, there is a need for solutions to readily provide desired etchant materials while limiting storage, safety, and transportation concerns.

SUMMARY

This summary may introduce a selection of concepts in a simplified form, which may be described in further detail below. This summary is not intended to necessarily identify key features or essential features of the claimed subject matter, nor is it intended to be used to limit the scope of the claimed subject matter.

Aspects of the present invention may overcome the deficiencies in the art by disclosing processes and systems which are able to form readily available etchants for the selected removal (etching) of material(s) from a substrate surface. In one aspect, the process for generating the etchant is incorporated into an etching process such that the etchant is provided in situ. In this way, minimal to no transportation or long-term storage of the etchant is needed for the etching process. In other aspects, the process for generating the etchant is incorporated into a deposition process having an etching step therein such that a material is deposited on a substrate to form a layer, and then a material is selectively etched from the deposited layer utilizing the in situ generated hydrogen halide.

As used herein, it is understood that the term "in situ" means that the hydrogen halide as described herein is generated at the same location or within the same system as the substrate surface to be etched. This means either the generated hydrogen halide either takes place within the same vessel (e.g., a reaction chamber of a semiconductor processing apparatus) which houses the substrate to be etched, or at least that the generated hydrogen halide is in fluid connection with and/or may otherwise be immediately contacted with the substrate to be etched following formation of the hydrogen halide. In this way, upon generation of the hydrogen halide etchant, the hydrogen halide is capable of being immediately delivered to the substrate surface upon, for example, the opening of a valve.

In one aspect, there is disclosed a method for the in situ generation of an etchant in a semiconductor processing apparatus, the method comprising generating in situ the etchant in the semiconductor processing apparatus in the form of a hydrogen halide generated from a precursor halide compound in the presence of a reactant comprising hydrogen or hydrogen and oxygen.

In another aspect, there is disclosed a method for etching an etchable material from a substrate in a semiconductor processing apparatus, the method comprising: generating in situ a hydrogen halide from a precursor halide compound in the presence of a reactant comprising hydrogen or hydrogen and oxygen; and selectively etching the etchable material from a surface layer of the substrate in the semiconductor processing apparatus via the hydrogen halide.

In yet another aspect, there is disclosed a semiconductor processing apparatus comprising: a hydrogen halide generation space within which a hydrogen halide is generated from a precursor halide compound in the presence of a reactant comprising hydrogen gas or hydrogen and oxygen; and a reaction chamber comprising a substrate comprising an etchable material on a surface layer thereof in fluid communication with the hydrogen halide generation space for selectively removing the etchable material from the surface layer via the hydrogen halide.

BRIEF DESCRIPTION OF DRAWINGS

The accompanying drawings, which are included to provide a further understanding of the disclosure and constitute a part of this specification, illustrate exemplary embodiments, and together with the description help to explain the principles of the disclosure. In the drawings.

Figure 1:
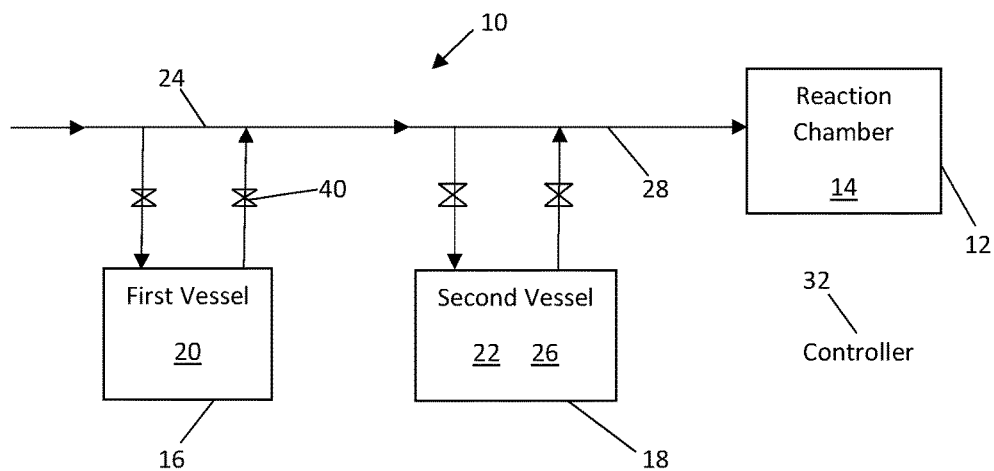
FIG. 1 illustrates an embodiment of a system for etching an etchable material from a surface layer of a substrate in accordance with an aspect of the present invention.

Elements in the figures are illustrated for simplicity and clarity and have not necessarily been drawn to scale. For example, the dimensions of some of the elements in the

DETAILED DESCRIPTION OF EXEMPLARY EMBODIMENTS

The description of exemplary embodiments of methods, structures, devices and apparatuses provided below is merely exemplary and is intended for purposes of illustration only. The following description is not intended to limit the scope of the disclosure or the claims. Moreover, recitation of multiple embodiments having stated features is not intended to exclude other embodiments having additional features or other embodiments incorporating different combinations of the stated features. For example, various embodiments are set forth as exemplary embodiments and may be recited in the dependent claims.

It will be understood by those in the art that the invention extends beyond the specifically disclosed embodiments and/or uses of the invention and obvious modifications and equivalents thereof. Thus, it is intended that the scope of the invention disclosed should not be limited by the particular disclosed embodiments described below. Unless otherwise noted, the exemplary embodiments or components thereof may be combined or may be applied separate from each other.

In this disclosure, any two numbers of a variable can constitute a workable range of the variable, and any ranges indicated may include or exclude the endpoints. Additionally, any values of variables indicated (regardless of whether they are indicated with "about" or not) may refer to precise values or approximate values and include equivalents, and may refer to average, median, representative, majority, or the like.

In one aspect, a method for the in situ generation of an etchant for a semiconductor processing apparatus is disclosed. The method comprises generating in situ the etchant for a semiconductor processing apparatus, wherein the etchant is in the form of a hydrogen halide generated from a precursor halide compound in the presence of a reactant comprising hydrogen or hydrogen and oxygen.

In an embodiment, the generating is done within a reaction chamber of a semiconductor processing apparatus housing a substrate, or alternatively within a vessel in communication with the reaction chamber within the semiconductor processing apparatus such that the generated hydrogen halide is generated in situ and is immediately available to selectively etch an etchable material from a surface layer of the substrate.

The generated hydrogen halide as described herein comprises the formula, HX, where X is a halogen, e.g., fluorine, chlorine, bromine, or iodine. In certain embodiments, the hydrogen halide comprises a member selected from the group consisting of HBr, HCl, HF, HI, and combinations thereof.

The precursor halide compound may comprise any suitable compound(s) suitable for forming the hydrogen halide in the presence of hydrogen or hydrogen and oxygen. In an embodiment, the precursor halide compound comprises a metal, a non-metal halide compound, a metalloid halide, or combinations thereof. In an embodiment, the metal, non-metal, or metalloid halide compound comprises the formula $MX_a$, wherein X=one or more halides, wherein M is a metal, non-metal, or metalloid, and wherein a=1 to 8. In a particular embodiment, the precursor halide compound comprises a metal halide. The metal of the metal halide may be any suitable metal, such as Al, Zr, or the like.

In other embodiments, the precursor halide compound comprises a non-metal halide compound. In an embodiment, the non-metal halide compound comprises the formula $MX_a$, wherein M is a non-metal, X=one more halides, and a=1 to 8. In further embodiments, the precursor halide compound comprises a metalloid halide compound. In an embodiment, the metalloid halide compound comprises the formula $MX_a$, wherein M is a metalloid, X=one or more halides, and a=1 to 8. In view of the above, in certain embodiments, the precursor halide compound comprises a compound selected from the following groups of compounds:

a. non-metal halides, such as $S_2Cl_2$, $Se_2Cl_2$, $SCl_2$, $SeCl_4$, $SeF_{4/6}$, or $SeCl_2$;
b. metalloid halides, such as $SiCl_4$, $SbCl_3$, $SbCl_5$, or $BCl_3$;
c. non-metal or metalloid oxyhalides, such as $SeO_2Cl_2$, $SO_2Cl_2$, NOF, NOCl, $NO_2F$, or $SeOCl_2$; or
d. mixed halides, such as $NCl_2F$, $NF_2Cl$, NOF, NOCl, or $NO_2F$.

When the precursor halide compound comprises an oxyhalide compound of the equation $MX_a$, wherein M is a non-metal, X=one more halides, and a=1 to 8, the oxygen component of the compound is understood to be included in the definition of M, but not counted in calculating the ratio of M to X. In addition, when the precursor halide compound comprises a mixed halide according to the formula $MX_a$, wherein M is a non-metal, X=one or more halides, and a=1 to 8, it is understood that the two or more halides in the formula are counted together as X. In certain embodiments, the precursor halide compound comprises a non-metal, such as S or Se. In other embodiments, the precursor halide compound comprises a metalloid, such as Si or Sb.

In a particular embodiment, the halide precursor compound comprises a member selected from the group consisting of $NbF_5$, $TiCl_4$, $SiCl_4$, $MoF_6$, $WF_6$, $TaF_5$, $AlCl_3$, $SbF_3$, $SF_4$, $SbF_5$, $SF_6$, and combinations thereof. In certain embodiments, when the precursor halide compound comprises a metalloid halide, the metalloid may be selected from the group consisting of boron, silicon, germanium, arsenic, antimony, tellurium, and combinations thereof. In a particular embodiment, a metalloid is used and the metalloid comprises silicon. In addition, in a particular embodiment, the precursor halide compound comprises at least one of $NbF_5$ or $SiCl_4$, and in certain embodiments each of $NbF_5$ or $SiCl_4$.

For purposes of illustration only, the generation of the hydrogen halide species may proceed according to the following reaction(s) when the precursor halide compound comprises $NbF_5$ and/or $SiCl_4$, and in certain embodiments each of $NbF_5$ and $SiCl_4$:

$$2NbF_5 + 5H_2O \rightarrow NbOF_x + HF \rightarrow Nb_2O_5 + 10HF$$

$$SiCl_4 + 2H_2O \rightarrow SiO_2 + 4HCl.$$

The generation of the hydrogen halide is done in the presence of a reactant comprising hydrogen or comprising both hydrogen and oxygen (otherwise referred to simply as "reactant" herein). In an embodiment, the reactant comprises hydrogen gas, a compound comprising both hydrogen and oxygen, or a gas mixture comprising both a hydrogen and an oxygen gas. Thus, in an embodiment, the generation of hydrogen halide is done in the presence of hydrogen gas. In other embodiments, both hydrogen and oxygen are utilized for the generation of the hydrogen halide species from the halide precursor compound.

In certain embodiments, at least a portion of the hydrogen and oxygen is provided from one or more members selected from the group consisting of water, $O_2$, ozone ($O_3$), hydrogen peroxide ($H_2O_2$), an organic acid, air, and combinations thereof. Alternatively, the hydrogen and oxygen may be provided from any other suitable species containing both hydrogen and oxygen.

In an embodiment, the hydrogen and oxygen necessary for reaction with the precursor halide compound are provided within the same compound. In such embodiments, the hydrogen and oxygen may be provided in the form of water, hydrogen peroxide, or an organic acid, such as formic acid or acetic acid. In particular embodiments, the oxygen/hydrogen compound is water and the generation of the hydrogen halide in the presence of water is also done in the absence of oxygen gas. In certain embodiments, the compound comprising both hydrogen and oxygen consists only of hydrogen and oxygen.

In other embodiments, the hydrogen and oxygen are provided as separate species in a gas mixture for the reaction with the halide precursor compound to generate the hydrogen halide. In an embodiment, the hydrogen is provided in the form of hydrogen ($H_2$) gas while the oxygen is provided in the form of $O_2$ or ozone ($O_3$). In certain embodiments, the gas mixture comprises $H_2$ and $O_2$. In certain embodiments, the gas mixture consists of consists only of hydrogen and oxygen gas.

In other embodiments, the reactant comprises a mixture of water and $O_2$. In certain embodiments, the reactant comprises water. In other embodiments, both oxygen and hydrogen are provided for the reaction with the precursor halide compound in the form of air.

The ratio of the precursor halide compound to the reactant may be any suitable amount which enables the subject reaction(s) to proceed. In certain embodiments, both hydrogen and oxygen are present and the amount of hydrogen and oxygen is present in an amount of 100 ppm or less, 50 ppm or less, 20 ppm or less, and in certain embodiments 10 ppm or less. In certain embodiments, at least a portion of the hydrogen and oxygen present for the generating of the hydrogen halide is in the form of oxygen and water, and wherein the total amount of water and oxygen present is 100 ppm or less, 50 ppm or less, 20 ppm or less, or 10 ppm or less. In embodiments comprising a mixture of $H_2$ and $O_2$, the mixture may comprise $H_2$ in an amount <5% by volume, <10% by volume, >60% by volume, or >70% by volume. In embodiments comprising $H_2$ and $H_2O$, the mixture may comprise $H_2$ in an amount of more than 50% by volume, more than 60% by volume, more than 70% by volume, more than 80% by volume, or less than 99.5% by volume.

The generation of the hydrogen halide may take place at any suitable temperature and pressure to provide a desired amount of the hydrogen halide. In an embodiment, the temperature may be from 0° C. to 500° C., such as from 0° C. to 200° C. In certain embodiments, the temperature may be in a range of from 20° C. to 100° C. or from 100° C. to 200° C. In certain embodiments, the generation of the hydrogen halide make take place at ambient or room temperature. By way of example only, $NbF_5$ and $SiCl_4$ may react with hydrogen and oxygen at room temperature to generate HF and HCl, respectively.

In an embodiment, the pressure for the generation of the hydrogen halide may be from 0.01 Torr to 300 Torr, such as from 0.01 Torr to 1 Torr. In certain embodiments, the temperature may be in a range of from 1 Torr to 10 Torr, 10 Torr to 100 Torr, 100 Torr to 300 Torr, or any other suitable range.

In certain embodiments, the temperature and/or pressure may be modified, e.g., increased or decreased, to increase or decrease a reaction rate of the hydrogen halide. By way of example, for each of $NbF_5$ and $SiCl_4$, the reaction rate increases and the conversion to HF and HCl, respectively, increases as the temperature is increased from 20° C. In certain embodiments, the pressure may instead or also be modified, e.g., increased or decreased, to increase or decrease a reaction rate of the hydrogen halide.

In particular embodiments, for example, the temperature is increased to a temperature of at least 20° C. and/or the pressure is increased to at least 1 Torr to increase a reaction rate of the hydrogen halide. It is appreciated that the generation of the hydrogen halide from the precursor halide compound may be suitably controlled to provide a desired dosage of the hydrogen halide (etchant) when the hydrogen halide is utilized as an etchant as set forth herein.

As set forth above, the processes for the generation of the hydrogen halide species may be utilized within a semiconductor processing apparatus for the in situ generation of a hydrogen halide for etching of a material in the semiconductor processing apparatus. As such, in accordance with another aspect of the present invention, there is disclosed a method for etching an etchable material from a substrate which comprises generating in situ a hydrogen halide from a precursor halide in the presence of a reactant comprising hydrogen or hydrogen and oxygen; and selectively etching the etchable material from a surface layer of the substrate via the hydrogen halide. The selectively etching step is typically performed within a reaction chamber of a semiconductor processing apparatus.

The semiconductor processing apparatus may comprise any suitable apparatus known in the art for depositing and/or etching a substrate therein, including commercially available units. In an embodiment, the semiconductor processing apparatus comprises a reactor comprising at least one reaction chamber for accommodating a substrate therein. The reactor may have, for example, two, three, six or eight reaction chambers and may comprise any suitable fluid paths, valves, etc. necessary for the input of desired materials to the reactor.

In some embodiments, the reactor may be part of a cluster tool in which a variety of different processes for the formation of an integrated circuit are carried out. In some embodiments, the reactor is a flow-type reactor. In some embodiments, the reactor may be a shower head type of reactor. In other embodiments, the reactor may comprise a space divided reactor. In some embodiments, the reactor may be a high-volume manufacturing-capable single wafer atomic layer deposition reactor. In other embodiments, the reactor may be a batch reactor comprising multiple substrates therein.

In the process, the generation of the hydrogen halide takes place as described above. In certain embodiments, the generated hydrogen halide may be stored within a suitable vessel and then delivered to one or more reaction chambers of the semiconductor processing apparatus for selective etching of one or more etchable materials from a surface layer of a substrate located within the reaction chamber. In other embodiments, the generation of the hydrogen halide may take place within the reaction chamber itself, and in certain embodiments, the hydrogen halide may form on a surface of the substrate.

The hydrogen halide will selectively etch one or more materials from a surface layer of a substrate which are etchable by the hydrogen halide while leaving behind one or more materials which are not etchable by the hydrogen halide, hence the term "selective etching." As used herein, the term "substrate" may refer to any underlying material or materials that may be used to form, or upon which a device, a circuit, or a material layer may be formed. A substrate can include a bulk material, such as silicon (e.g., single-crystal silicon) and can include one or more layers overlying the bulk material. The substrate may further include various topologies, such as gaps, including recesses, lines, trenches, or spaces between elevated portions, such as fins, and the like formed within or on at least a portion of a layer of the substrate. Suitable substrate materials may include nitrides, oxides, insulating materials, dielectric materials, conductive materials, metals, such as such as tungsten, ruthenium, molybdenum or copper, or metallic materials, crystalline materials, epitaxial, heteroepitaxial, and/or single crystal materials. In certain embodiments, the substrate comprises a semiconductor substrate, such as a silicon wafer.

The substrate has a surface layer, which refers an outermost surface at one least one side which comprises at least one material which may be etched by a hydrogen halide ("etchable material") and at least one material which will not be etched by the hydrogen halide ("non-etchable material"). In this way, the in situ generated hydrogen halide may selectively etch the etchable material from the surface layer. In certain embodiments, the substrate comprises a semiconductor substrate, and a surface layer of the layer comprises the etchable material and the non-etchable material.

In one embodiment, the etchable material may comprise any material which may be etched by the hydrogen halide. In an embodiment, the etchable material comprises one or more of metal nitrides, such as TiN, TaN, or MoN; metals, such as Mo, Nb, Ti, Ni, or Co; oxides, such $TiO_2$, $Ta_2O_5$, or $SiO_2$; or metal carbides, such as TiC, TaC, or MoC. In a particular embodiment, the etchable materials comprises $AlO_x$, $HfO_x$, or $TiO_x$. In certain embodiments, the etchable material comprises $AlO_x$ may be selectively etched from at least one other non-etchable material in the surface layer via the hydrogen halide.

The $AlO_x$ may be of any stoichiometry, including $Al_2O_3$, however, it is understood the present invention is not so limited to $Al_2O_3$. In other embodiments, the $AlO_x$ may comprise doped ALD grown $AlO_x$. The dopant may be suitable material, such as H, Si, Hf, Ti, Zr, or Nb. The $AlO_x$ may further be amorphous or crystallized. Amorphous $AlO_x$ tends to etch faster than crystallized $AlO_x$. In an embodiment, the ratio of Al:O, material thickness, or annealing conditions may further contribute to etch selectivity by the hydrogen halide. The etching can also be dopant level dependent. For example, under similar etch conditions, the lightly doped Ti:$AlO_x$, such as less than 5 at. % Ti doped $AlO_x$ etches slower than heavily doped Ti:$AlO_x$, such as more than 5 at. % Ti in $AlO_x$. Under different etch conditions, the lightly doped Ti:$AlO_x$, such as less than 5 at. % Ti-doped $AlO_x$ etches faster than heavily doped Ti:$AlO_x$, such as more than 5 at. % Ti in $AlO_x$.

The non-etchable material of the surface layer of the substrate may comprise any suitable material which is not etched by the hydrogen halide. Exemplary non-etchable materials include but are not limited to nitrides, oxides, e.g., silicon oxides or the like. In particular embodiments, the non-etchable material comprises a member selected from the group consisting of TiN, W, SiN, Si, and AlN. The etching chemistry and etching conditions, such as temperature, etch duration, pressure and etchant concentration, may be selected according to the needs of a specific application to selectively etch one material over another. Thus, a given material may be an etchable material under some conditions, and a non-etchable material under other conditions. As an example, under certain etch conditions, $Al_2O_3$ is etched at temperatures starting at 350° C., while $SiO_2$ remains non-etchable at least up to 430° C. Another example is where TiN is etched above temperatures starting at 200° C. while $SiO_2$ and $Al_2O_3$ remains non-etchable, under similar etch conditions. Silicon nitride is also non-etchable as such at least up to 350° C., under similar etch conditions, while TiN and $Al_2O_3$ can be etched.

The substrate may be contacted with the generated hydrogen halide for any suitable duration of time effective to bring about the desired degree of etching. In an embodiment, the duration is from 0.5 seconds to 60 seconds, such as from 0.5 to 5 seconds. In certain embodiments, the generated hydrogen halide is introduced into the reaction chamber via a suitable carrier gas. In certain embodiments, the carrier gas comprises nitrogen. In particular embodiments, the selectively etching step is done utilizing nitrogen ($N_2$) having a 6.0 purity or less, and in certain embodiments 5.0 purity or less as a carrier gas for the hydrogen halide. In certain embodiments, the nitrogen gas having a 6.0 purity or less may provide a portion, if not all, of the hydrogen and oxygen necessary to generate the desired amount of the hydrogen halide.

In addition, the etching may take place at any suitable temperature. In an embodiment, the etching is done at a temperature of from 20° C. to 1200° C., such as 250° C. to 600° C. or 390° C. to 470° C. In addition, the etching may take at any suitable etch rate to achieve the desired result. In an embodiment, the etching is done an etch rate of 0.01 to 5 Å/cycle. In certain embodiments, the etch rate is from 0.01 to 0.1 Å/cycle, 0.1 to 1 Å/cycle, or from 1 Å/cycle to 5 Å/cycle. In certain embodiments, the etch rate is dependent on a partial pressure of the hydrogen halide. In this way, the etch rate may be controlled, for example, by increasing the partial pressure of the hydrogen halide.

The concentration of the hydrogen halide may be any suitable amount effective to achieve the desired etching. In an embodiment, the concentration is measured as a partial pressure of the hydrogen halide, and the hydrogen halide is provided at a partial pressure of from 0.01 to 0.9 Pa, such as from 0.1 to 0.5 Pa. In other embodiments, the concentration may be varied by alternating a mass flow of the hydrogen halide.

In certain embodiments, the generating and selective etching steps are done simultaneously. For example, in one embodiment, the hydrogen halide may be formed within the reaction chamber itself of a semiconductor processing apparatus, such that the hydrogen halide is immediately available for the selective etching step. In other embodiments, the generating and selective etching steps may performed non-simultaneously.

In either case (simultaneously or non-simultaneously), the step of generating the hydrogen halide may be generated in a discrete vessel located upstream from a reaction chamber within which the step of selectively etching takes place. In a particular embodiment, the hydrogen halide may be generated in a first housing, e.g., a reactor vessel, located upstream from the reaction chamber and then directed, as needed, to the reaction chamber for the etching. In other embodiments, the generating of the hydrogen halide may take place in a first reactor vessel with the generated hydrogen halide being stored within a second housing, and the hydrogen halide may be directed from the second housing to the reaction chamber as needed for etching. In an embodiment, the hydrogen halide is still being produced in the first housing (reactor vessel) while being delivered to the reaction chamber for etching.

In some embodiments, if necessary, the exposed surfaces of a substrate can be pretreated to amend the substrate surface properties prior to etching. In some embodiments, a separate pretreatment step is not required. In some embodiments, the substrate is pretreated to provide a desired surface termination. In some embodiments, the substrate is pretreated with plasma.

In certain embodiments, the etching may be performed at temperatures ranging from about 20 to about 1200° C., about 50 to about 800° C., about 75 to about 600° C., about 300° C. to about 500° C., or from about 350° C. to about 450° C. In some embodiments, the temperature is greater than about 20, 50 or 100° C., but less than about 1000, 800, 600 or 500° C. In some embodiments, the etching may be carried out at a temperature of about 450° C.

In addition, the etching may be done at a pressure of from about 0.001 to about 100 torr. However, in some cases the pressure will be higher or lower than this range, as can be determined by the skilled artisan given the particular circumstances. In some cases, the reaction chamber (reactor) can be operated either in isothermal (such as hot-wall) or non-isothermal (such as cold-wall) conditions. In certain embodiments, the reaction chamber does not interact with etching chemistries and may also not interact with substrates. In some embodiments, the reaction chamber can be a hot-wall, cold and even warm-wall type of reaction chamber.

In accordance with another aspect, the hydrogen halide and etching processes disclosed herein may be integrated with a deposition process such that the generated hydrogen halide may be utilized to etch an etchable material from a deposited material resulting from the deposition. Without limitation, the deposition process may be a chemical vapor deposition (CVD), plasma-enhanced CVD (PECVD), physical vapor deposition (PVD), atomic layer deposition (ALD), or a plasma-enhanced ALD (PEALD) process. In an embodiment, the process for the in situ generation of a hydrogen halide and/or for etching as disclosed herein is integrated into a process for depositing a material on a substrate. Thus, in certain embodiments, the methods as described herein may further comprise, prior to the selectively etching, depositing the surface layer on the substrate, the surface layer comprising at least the etchable material and the non-etchable material. In an embodiment, the depositing is done by an atomic layer desorption (ALD) process.

As used herein, an ALD process refers to a vapor deposition process in which deposition cycles, such as a plurality of consecutive deposition cycles, are conducted. ALD is based on controlled, often self-limiting surface reactions, of precursor chemicals. Gas phase reactions are avoided by feeding the precursors alternately and sequentially into a reaction chamber. Generally, during each cycle, a first precursor is chemisorbed to a deposition surface (e.g., a substrate surface that may include a previously deposited material from a previous ALD cycle or other material), thereby forming about a monolayer or sub-monolayer of material that does not readily react with additional first precursor. Thereafter, in some cases, a second precursor or reaction gas may subsequently be introduced into the reaction chamber for use in converting the chemisorbed precursor to the desired material on the deposition surface.

Vapor phase reactants are separated from each other in the reaction chamber, for example, by removing excess reactants and/or reactant by-products from the reaction chamber between reactant pulses. This may be accomplished with an evacuation step and/or with an inactive gas pulse or purge. In some embodiments the substrate is contacted with a purge gas, such as an inert gas. For example, the substrate may be contacted with a purge gas between reactant pulses to remove excess reactant and reaction by-products.

In certain embodiments, the deposition process, e.g., ALD process, will deposit a material which is etchable material by the hydrogen halide (etchable material), as well as a material which is non-etchable material by the hydrogen halide (non-etchable material). In this way, the etchable material may be selectively etched from a surface layer of the substrate. The selective etching step may be performed at any suitable timeframe after the deposition takes place.

In accordance with another aspect, it is also contemplated that the selective etching may be instead used for cleaning the walls of a reaction vessel or chamber. For example, if material(s), which are etchable by the hydrogen halide, are collected on a surface of the walls, e.g., unwanted metals or metal oxides, the generated hydrogen halide may be utilized to reduce or completely remove the etchable material(s) from the walls. As such, in an embodiment, the substrate may comprise the walls of a reaction chamber. The etching may done at any suitable time in a deposition process.

Some processing steps of semiconductor device manufacturing, such as chemical-mechanical polishing (CMP), used to remove material from a substrate surface or to planarize the substrate surface, may leave contaminating material on a substrate surface. As another example, area-selective deposition of different materials may lead to target material growth on undesired surfaces of the substrate. Selective etching according to the current disclosure may be used to remove the unwanted material, such as a metal, for example Cu, or a metal oxide, such as $AlO_x$, from the substrate.

In accordance with another aspect, there is disclosed a semiconductor processing apparatus for carrying out the above-described methods. In an embodiment, the apparatus comprises a hydrogen halide generation space within which the hydrogen halide is generated from the halide precursor compound in the presence of hydrogen or hydrogen and oxygen. In addition, the apparatus further includes a reaction chamber comprising a substrate comprising an etchable material on a surface layer thereof in fluid communication with the hydrogen halide generation space for selectively removing the etchable material from the surface layer via the hydrogen halide.

As used herein, the "hydrogen halide generation space" refers generally to the location where at least a majority of the hydrogen halide delivered to the reaction chamber for etching is generated. In certain embodiments, the hydrogen halide generation space may be located within the same location as the substrate. For example, in an embodiment, the hydrogen halide generation space may be located within the reaction chamber itself. In other embodiments, the hydrogen halide generation space may be located within a housing having walls, the hydrogen halide generation space being discrete from the reaction chamber but is in fluid communication with the reaction chamber. For example, in a particular embodiment, the hydrogen halide generation space may be located within a dedicated vessel, e.g., a sealed vessel or generation chamber, having an input for reactant(s) and an outlet for delivery of the generated hydrogen halide to the reaction chamber. In other embodiments, the hydrogen halide generation space may be located within a source of at least one of the reactants for generation of the hydrogen halide. In certain embodiments, the hydrogen halide generation space may be located upstream from the reaction chamber, but remains in fluid connection therewith.

Further, in certain embodiments, the apparatus comprises a source of the precursor halide compound and a source of the reactant (hydrogen or hydrogen and oxygen component) in fluid communication with the hydrogen halide generation space. In certain embodiments, the hydrogen halide generation space may be located within one of the components needed for the reaction. For example, the hydrogen halide generation space may be located with a source of the halide precursor compound. In such case, the hydrogen or hydrogen and oxygen is introduced into the source of the precursor halide compound to allow for generation of the hydrogen halide within the source of the precursor halide compound. It is appreciated that the apparatus further includes suitable fluid lines, valves, pumps, or other components as needed for delivery of the materials to the hydrogen halide generation space.

In one embodiment, the source of the precursor halide compound is in fluid communication with a first valve, and the reactant is in fluid communication with a second valve, and the apparatus further comprises a controller operably connected to the first and second valves. The controller is configured and programmed to control supplying the precursor halide compound and the reactant to the hydrogen halide generation space through the first and second valves. The controller can be a processor, CPU, server, mainframe, or other suitable controller or device which is capable of adjusting and controlling the flow of a material from one location to another.

In certain embodiments, multiple hydrogen halides are generated for the etching step. In such cases, a first hydrogen halide may be introduced into the reaction chamber for etching followed by at least a second hydrogen halide different from the first hydrogen halide. Accordingly, in an embodiment, the apparatus may further comprise a plurality of hydrogen halide generation spaces or any other component as described herein to carry out the generation of two distinct hydrogen halides. In certain embodiments, the plurality of hydrogen halide generation spaces comprises at least a first reaction vessel and a second reaction vessel discrete from the first reaction vessel such that each is dedicated to the generation of a specific hydrogen halide. In some embodiments, the multiple hydrogen halides may be generated in a single hydrogen halide generation space.

As was also discussed above, the in situ generation of the hydrogen halide and the etching steps described herein may be incorporated into a deposition process, e.g., an ALD process, as is known in the art. As such, in certain embodiments, the apparatus may further include any components necessary to carry out the deposition process. In an embodiment, for example, the apparatus may comprise one or more sources of a deposition material comprising the etchable material along with at least one other metal or metalloid material. The one or more sources of a deposition material are arranged to supply the etchable material and the least one other metal or metalloid material for deposition on the substrate and for forming the surface layer on the substrate.

In addition, in certain embodiments, the source(s) of a deposition material are in fluid communication with a third valve. As with the reactants for the generation of the hydrogen halide, the controller may similar be operably connected to the third valve and configured and programmed to control supplying the deposition material(s) to the reaction chamber through the third valve for deposition of the deposition material(s) on the substrate.

In certain embodiments, any housing which includes the hydrogen halide at least temporarily may be formed from a corrosion resistant material or may include a corrosion resistant coating or the like. In an embodiment, the housing may be formed from a quartz material or a corrosion resistant metal or metal alloy, such as, for example, Hastelloy or Monel. In other embodiments, the housing which includes the hydrogen halide may be coated with a fluorine based film, such as, for example, polytetrafluoroethylene (PTFE), fluorinated ethylene propylene copolymer (FEP), perfluoroalkoxy (PFA), or terephthalate copolymer (PETG), or polyamide based copolymers.

In some embodiments, the apparatus may comprise more than one reaction chamber. In some embodiments, the apparatus may comprise at least one reaction chamber comprising more than one reaction stations (multi-station chamber). In some embodiments, etching and deposition may be performed in different stations and/or chambers.

Now referring to the Figures, FIG. 1 illustrates an apparatus 10 for carrying out the in situ generation of a hydrogen halide in accordance with an aspect of the present invention. In the embodiment of FIG. 1, the generation of the hydrogen halide takes place upstream from the reaction chamber 12. The reaction chamber 12 houses a substrate 14 having a surface layer to be etched. As shown, there is a first vessel 16 which may contain therein either of the reactants for the generation of the hydrogen halide, e.g., either the hydrogen or oxygen/hydrogen reactant(s) 20 or the precursor halide compound reactant(s) 22. A second vessel 18 is provided which contains the other of the reactants 20, 22 for the reaction. A carrier gas 24, e.g., 6.0 or 5.0 nitrogen, flows from a suitable source thereof to the first vessel 16 to carry a desired amount of reactant 20 from the first vessel 16 to the second vessel 18. The generation of the hydrogen halide 28 from the precursor halide compound 22 in the presence of hydrogen or hydrogen and oxygen 20 takes place in the second vessel 18, thereby defining a hydrogen halide generation space 26. Once formed, the hydrogen halide 28 may be directed to the reaction chamber 12 via the carrier gas 24 for the etching step.

As shown, the apparatus 10 may comprise one or more valves 40 (FIGS. 1 and 5), e.g., a needle, hand, pneumatic valve or other valve, pumps, or the like for controlling the flow of materials through the apparatus 10. A controller 32 may also be included which is operably connected to the valves, pumps, and components of the apparatus for controlling the flow and delivery of components through the apparatus as would be well understood by those of ordinary skill in the art.

Figure 2:
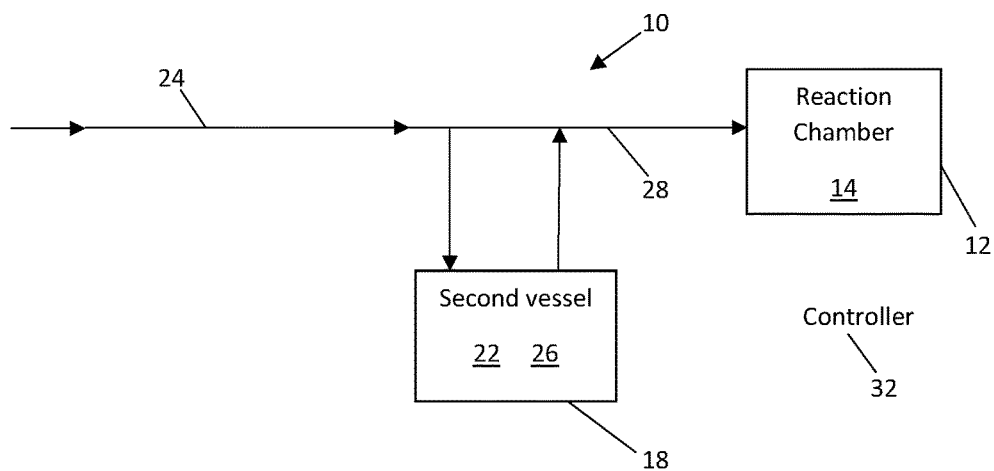
FIG. 2 illustrates an embodiment of a system for etching an etchable material from a surface layer of a substrate in accordance with another aspect of the present invention.

Referring to FIG. 2, there is shown another embodiment of the apparatus, wherein the hydrogen halide is instead generated within a vessel, e.g., second vessel 18. However, in this instance, as shown, there is no first vessel 16 housing a first reactant, such as the hydrogen or oxygen and hydrogen-containing components. In this embodiment, the carrier gas having a suitable purity, e.g., a purity of 6.0 or less, provides the necessary hydrogen or hydrogen and oxygen for the reaction to take place. In particular, the carrier gas 24 is directed to the second vessel 18 for reaction with the precursor halide compound in the second vessel 18 to form the hydrogen halide 28, which is then directed to the reaction chamber 12.

Figure 3:
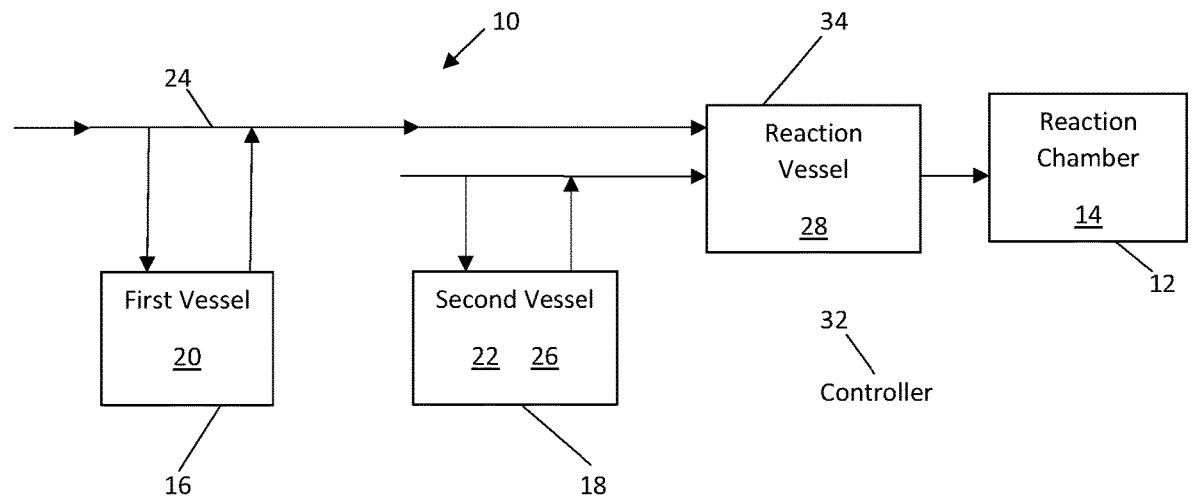
FIG. 3 illustrates an embodiment of a system for etching an etchable material from a surface layer of a substrate in accordance with yet another aspect of the present invention.

In another embodiment, as shown in FIG. 3, the configuration may also have a similar arrangement to FIG. 1 with the exception of the addition of a dedicated reaction vessel 34 within which the generation of the hydrogen halide 28 takes place. In this embodiment, the carrier gas 24 carries reactant, which may be the precursor halide compound 20 or the reactant 22 (hydrogen or hydrogen and oxygen), to the dedicated reaction vessel 34. In addition, a carrier gas 24 from the same or a different source will in turn direct reactant 22 to the dedicated reaction vessel 34.

Figure 4:
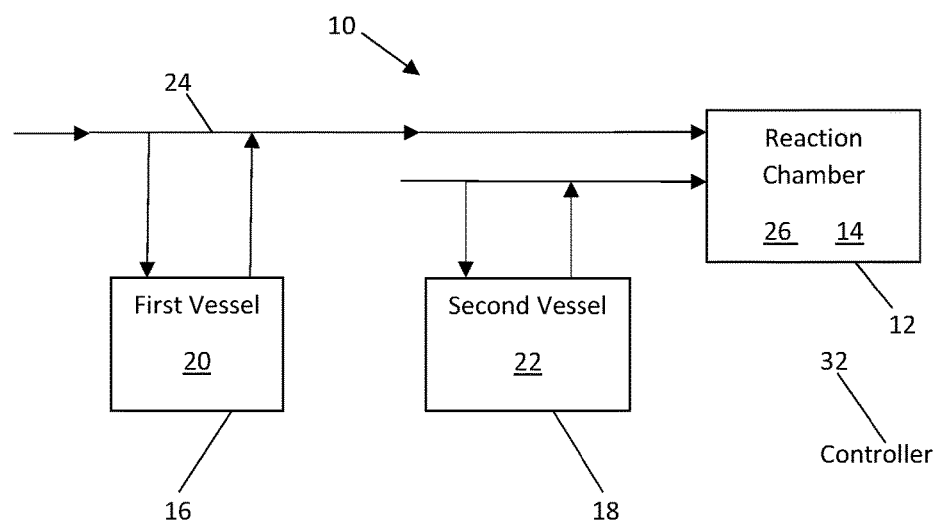
FIG. 4 illustrates an embodiment of a system for etching an etchable material from a surface layer of a substrate in accordance with yet another aspect of the present invention.

In still another embodiment, as shown in FIG. 4, it is contemplated that the generation of the hydrogen halide 28 may take place within the same location where the substrate 14 is located, e.g., within the reaction chamber 12 of the apparatus 10. For example, as shown in FIG. 4, the precursor halide compound 20 from the first vessel 16 and the reactant 22 (e.g., hydrogen or hydrogen and oxygen) from the second vessel 18 may be directed to, and then reacted within the reaction chamber 12. In this way, the generated hydrogen halide, e.g., HF or HCl, may be generated on a surface layer of the substrate 14.

Figure 5:
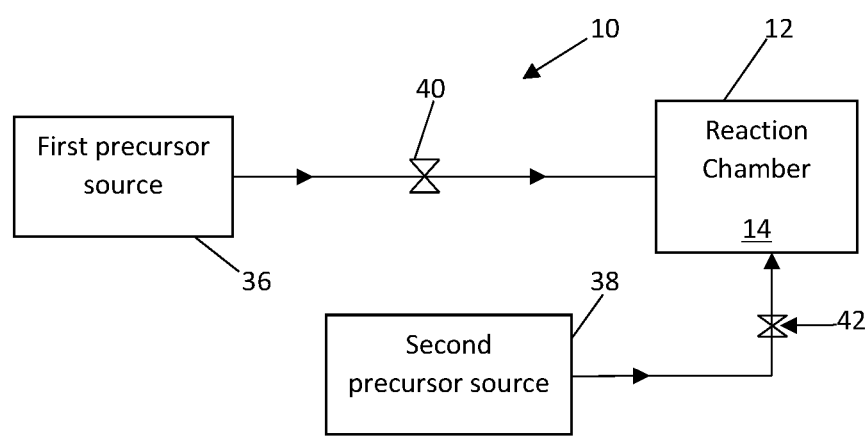
FIG. 5 illustrates an embodiment of a system for depositing a material, including a material to be etched, in accordance with yet another aspect of the present invention.

In further embodiments, as mentioned above, the methods described herein for generating the hydrogen halide and etching may be utilized in conjunction with methods for depositing a film on a substrate, wherein the deposited comprises at least a material to be etched with the hydrogen halide (etchable material) and a material which will not be etched by the hydrogen halide. To accomplish the deposition, as shown in FIG. 5, the apparatus 10 may further include a source of one or more precursors for the deposition. In the embodiment shown, there is provided a source 36 of a first precursor and a source 38 of a second precursor, which may deliver the first precursor and the second precursor to the reaction chamber 12 for deposition of the precursor materials on the substrate 14 in the reaction chamber 12. Similar to the above, one or more valves 40 may be provided on suitable fluid paths to enable control of the flow of the first or second precursors into the reaction chamber 12. In addition, the precursor sources 36, 38 may be part of a standard ALD arrangement having a valve 40 for controlling a purge gas 42 such that the purge gas 42 may be introduced into the reaction chamber 12 from a suitable source subsequent to the introduction/pulsing of the precursors into the reaction, or as is otherwise needed. It is understood that the components, e.g., first source 16, second source 18, and the like for the generation of the hydrogen are not illustrated for ease of illustration, but are understood to be combinable in any arrangement with the components shown in FIG. 5.

It is to be understood that the configurations and/or approaches described herein are exemplary in nature, and that these specific embodiments or examples are not to be considered in a limiting sense, because numerous variations are possible. The specific routines or methods described herein may represent one or more of any number of processing strategies. Thus, the various acts illustrated may be performed in the sequence illustrated, in other sequences, or omitted in some cases.

The invention claimed is:

1. A method for the in situ generation of an etchant in a semiconductor processing apparatus, the method comprising:
generating in situ the etchant in the semiconductor processing apparatus in the form of a hydrogen halide generated from a precursor halide compound in the presence of a reactant comprising hydrogen or hydrogen and oxygen,
wherein the precursor halide compound comprises a member selected from the group consisting of a metal halide, a non-metal halide, a metalloid halide, and combinations thereof; and
wherein the precursor halide compound comprises a mixed halide compound or an oxyhalide compound.

2. The method according to claim 1, wherein the precursor halide compound comprises a formula $MX_a$, wherein X is one or more halides, and wherein M is a metal, non-metal, or metalloid, and a=1 to 8.

3. The method according to claim 1, wherein the reactant is selected from the group consisting of a hydrogen gas, a compound comprising both hydrogen and oxygen, a gas mixture comprising both hydrogen and oxygen gas, and combinations thereof.

4. The method according to claim 1, further increasing temperature and/or pressure to increase a reaction rate of the hydrogen halide, wherein the temperature is increased to a temperature of at least 20° C. and/or the pressure is increased to at least 1 Torr to increase the reaction rate of the hydrogen halide.

5. The method according to claim 1, wherein the generating is done within a reaction chamber of the semiconductor processing apparatus or within a vessel in gas communication with the reaction chamber of the semiconductor processing apparatus.

6. A method for etching an etchable material from a substrate in a semiconductor processing apparatus, the method comprising:
generating in situ a hydrogen halide from a precursor halide compound in the presence of a reactant comprising hydrogen or hydrogen and oxygen; and
selectively etching the etchable material relative to another material on the substrate from a surface layer of the substrate in the semiconductor processing apparatus via the hydrogen halide,
wherein the precursor halide compound comprises a member selected from the group consisting of a metal halide, a non-metal halide, a metalloid halide, and combinations thereof, and
wherein the precursor halide compound comprises a mixed halide compound or an oxyhalide compound.

7. The method according to claim 6, wherein the reactant is selected from the group consisting of a hydrogen gas, a compound comprising both hydrogen and oxygen, a gas mixture comprising both hydrogen and oxygen, and combinations thereof.

8. The method according to claim 6, wherein the substrate comprises a semiconductor substrate, and wherein the surface layer comprises the etchable material and a non-etchable material which is not etchable by the hydrogen halide.

9. The method according to claim 8, wherein the etchable material comprises $AlO_x$, and wherein the $AlO_x$ is selectively etched from the non-etchable material in the surface layer via the hydrogen halide.

10. The method according to claim 8, wherein the non-etchable material comprises a member selected from the group consisting of TiN, W, SiOx, SiN, Si, and AlN.

11. The method according to claim 8, further comprising, prior to the selectively etching, depositing the surface layer on the substrate, the surface layer comprising at least the etchable material and the non-etchable material.

12. The method according to claim 6, wherein the etchable material comprises a member selected from the group consisting of a metal nitride, metal, oxide, carbide, and combinations thereof.

13. The method according to claim 6, wherein the substrate comprises sidewalls of a reaction chamber of the semiconductor processing apparatus.

14. The method according to claim 6, wherein the selectively etching is done utilizing nitrogen ($N_2$) having a 5.0 purity or less as a carrier gas for the hydrogen halide.

15. The method according to claim 6, wherein the selectively etching is done at a temperature of from 390° C. to 470° C. and at an etch rate of 0.01 to 5 Å/cycle.

16. The method according to claim 6, wherein the generating and selectively etching steps are done simultaneously.

* * * * *